United States Patent
Liu

(10) Patent No.: US 6,707,672 B2
(45) Date of Patent: Mar. 16, 2004

(54) HEAT SINK CLIP ASSEMBLY

(75) Inventor: HouBen Liu, Shenzhen (CN)

(73) Assignee: Hon Hai Precision Ind. Co., Ltd., Taipei Hsien (TW)

( * ) Notice: Subject to any disclaimer, the term of this patent is extended or adjusted under 35 U.S.C. 154(b) by 0 days.

(21) Appl. No.: 10/173,467

(22) Filed: Jun. 14, 2002

(65) Prior Publication Data

US 2003/0214787 A1 Nov. 20, 2003

(51) Int. Cl.[7] ................................................ H05K 7/20
(52) U.S. Cl. .......................... 361/704; 24/458; 165/185; 257/719
(58) Field of Search ................................ 361/697, 703, 361/704, 717–720; 174/16.3; 165/80.3, 185; 248/505, 510; 257/718, 719, 722, 726, 727; 24/453, 457, 458

(56) References Cited

U.S. PATENT DOCUMENTS

| | | | | |
|---|---|---|---|---|
| 4,509,839 A | * | 4/1985 | Lavochkin | .................. 257/718 |
| 4,716,494 A | * | 12/1987 | Bright et al. | ................ 361/704 |
| 5,323,845 A | * | 6/1994 | Kin-shon | .................... 165/80.3 |
| 5,486,981 A | * | 1/1996 | Blomquist | |
| 6,125,037 A | * | 9/2000 | Bollesen | |
| 6,362,963 B1 | * | 3/2002 | Lee et al. | .................... 361/704 |
| 6,452,801 B1 | * | 9/2002 | Chen | .......................... 361/704 |
| 6,483,707 B1 | * | 11/2002 | Freuler et al. | .............. 361/713 |

* cited by examiner

Primary Examiner—Gerald P Tolin
(74) Attorney, Agent, or Firm—Wei Te Chung

(57) ABSTRACT

A heat sink clip assembly includes a clip (10) and a frame (50). The clip is formed from a single strand of resilient metallic material that is bent and coiled to become generally U-shaped. The clip includes a retaining bar (11), and two confining poles (12) extending perpendicularly from opposite ends of the retaining bar. Each confining pole comprises a first resilient section (14) near a distal end of the confining pole, a fastener (18) at the distal end of the confining pole, and a second resilient section (16) adjacent the retaining bar. Each first resilient section has a pressed head (142) with a handle (30) attached thereon. The frame comprises a plurality of locking fingers (52) extending perpendicularly from a flat rectangular board. Each locking finger has a hook (53, 54) for respectively locking the retaining bar or one of the fasteners of the clip.

18 Claims, 5 Drawing Sheets

HEAT SINK CLIP ASSEMBLY

BACKGROUND OF THE INVENTION

1. Field of the Invention

The present invention relates to heat sink clip assemblies, and particularly to heat sink clip assemblies with simple structure for securely attaching a heat sink to an electronic device.

2. Description of the Prior Art

Advances in microelectronics technology have resulted in electronic devices that process signals and data at unprecedented high speeds. During operation of many contemporary electronic devices, large amounts of heat are produced. The heat must be efficiently removed, to prevent the electronic device from becoming unstable or being damaged. Heat sink assemblies are frequently used to dissipate heat from these electronic devices.

A clip is often used to attach a heat sink to an electronic device. The clip is usually integrally formed from sheet metal. A typical such clip is formed by bending the sheet metal to correspond to a profile of the heat sink. The clip wraps over the heat sink, and is secured to a fixture such as a motherboard with screws. However, the clip is unduly large, and requires a considerable quantity of material for manufacture. In addition, securing of the clip with screws requires a tool. Attachment and detachment of the clip are unduly laborious and time-consuming.

SUMMARY OF THE INVENTION

Accordingly, an object of the present invention is to provide a heat sink clip assembly with simple structure for securely attaching a heat sink to an electronic device.

Another object of the present invention is to provide a heat clip assembly that can be conveniently assembled and disassembled.

To achieve the above-mentioned objects, a heat sink clip assembly in accordance with a preferred embodiment of the present invention includes a clip and a frame. The clip is formed from a single strand of resilient metallic material that is bent and coiled to become generally U-shaped. The clip comprises a retaining bar, and two confining poles extending perpendicularly from opposite ends of the retaining bar respectively. Each confining pole comprises a first resilient section near a distal end of the confining pole, a fastener at the distal end of the confining pole, and a second resilient section adjacent the retaining bar. The second resilient section comprises a plurality of coiled loops. Each confining pole at the first resilient section forms a plurality of loops, and extends to form a pressed head. A handle is attached onto each pressed head for facilitating pressing of the confining pole. The frame comprises a plurality of locking fingers extending perpendicularly from a flat rectangular board. Each locking finger has a hook for respectively locking the retaining bar or one of the fasteners of the clip.

Other objects, advantages and novel features of the present invention will become more apparent from the following detailed description when taken in conjunction with the accompanying drawings, in which:

DETAILED DESCRIPTION OF THE INVENTION

Figure 1:
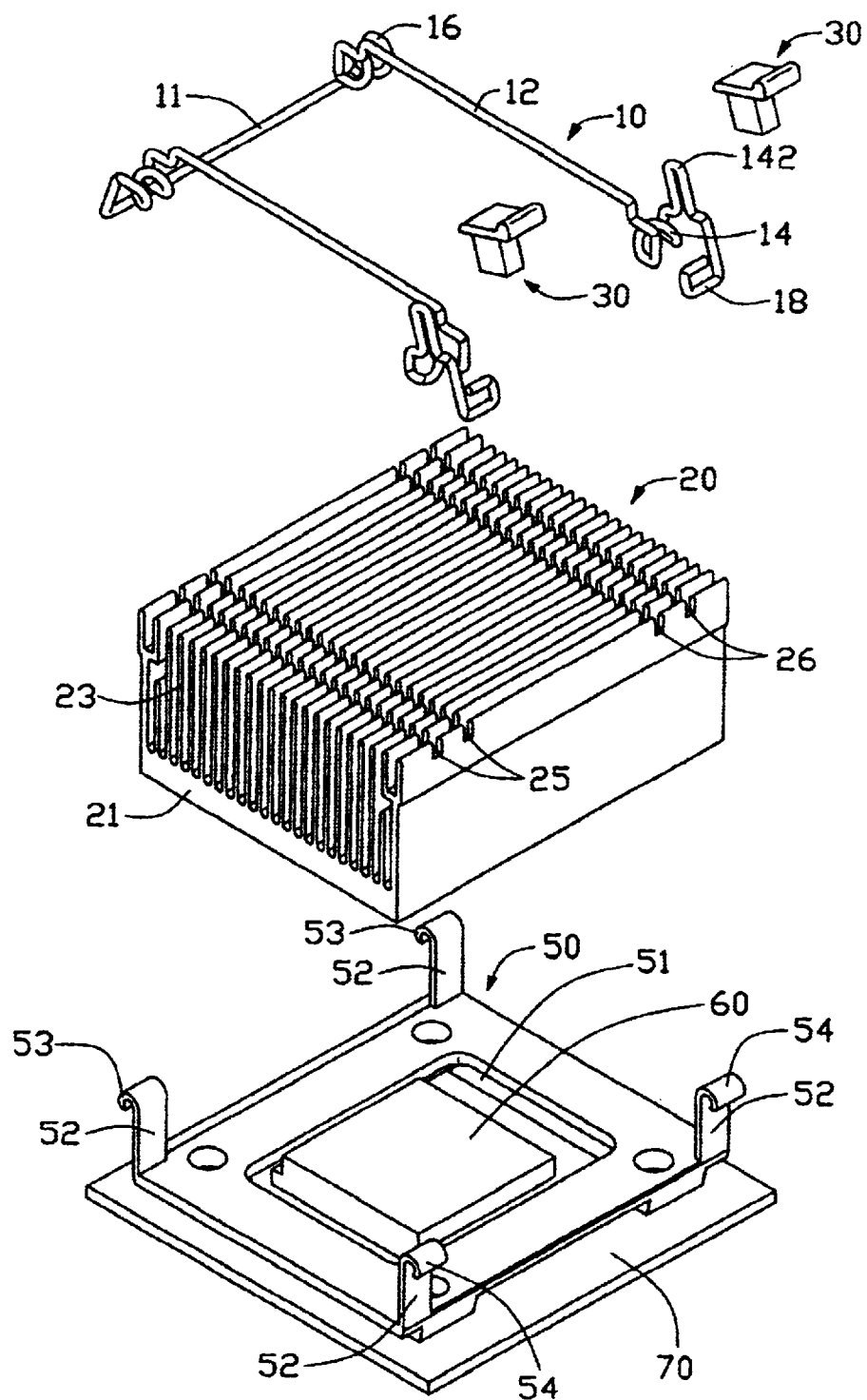
FIG. 1 is an exploded perspective view of a heat sink clip assembly in accordance with a preferred embodiment of the present invention, together with a heat sink.
Figure 2:
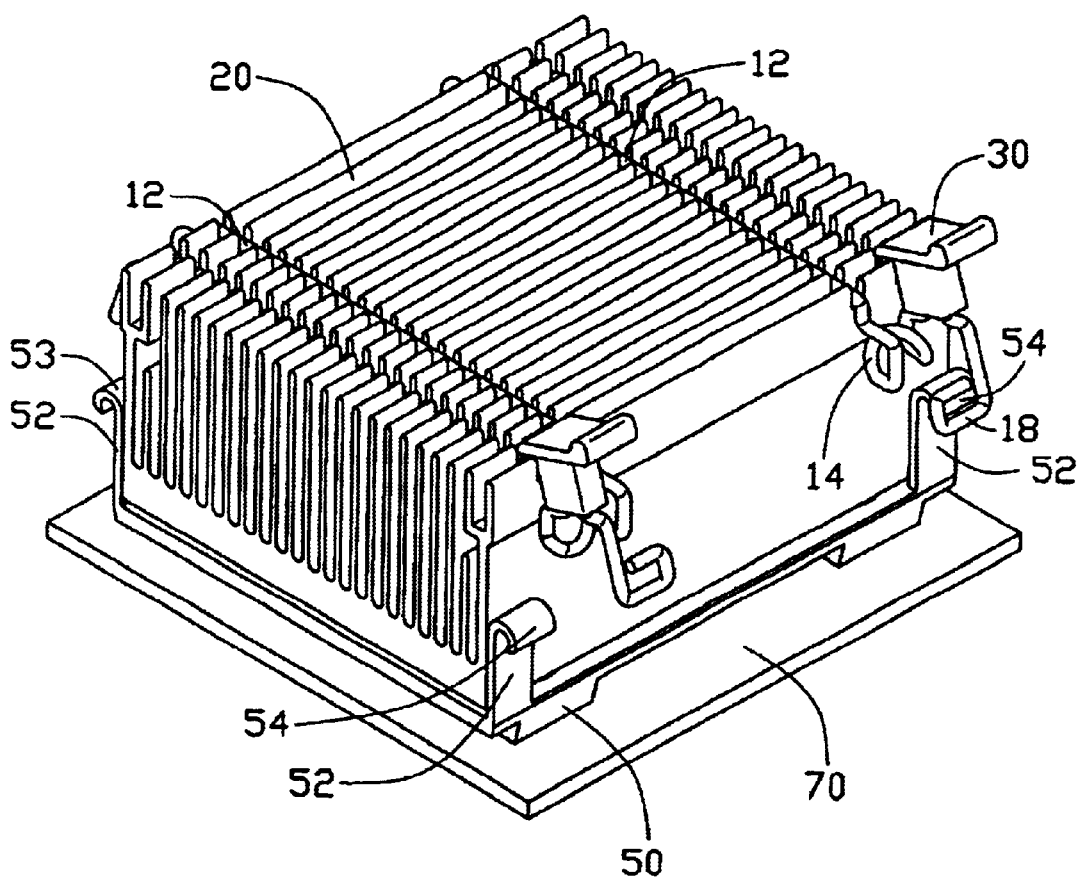
FIG. 2 is a partly assembled view of FIG. 1.
Figure 3:
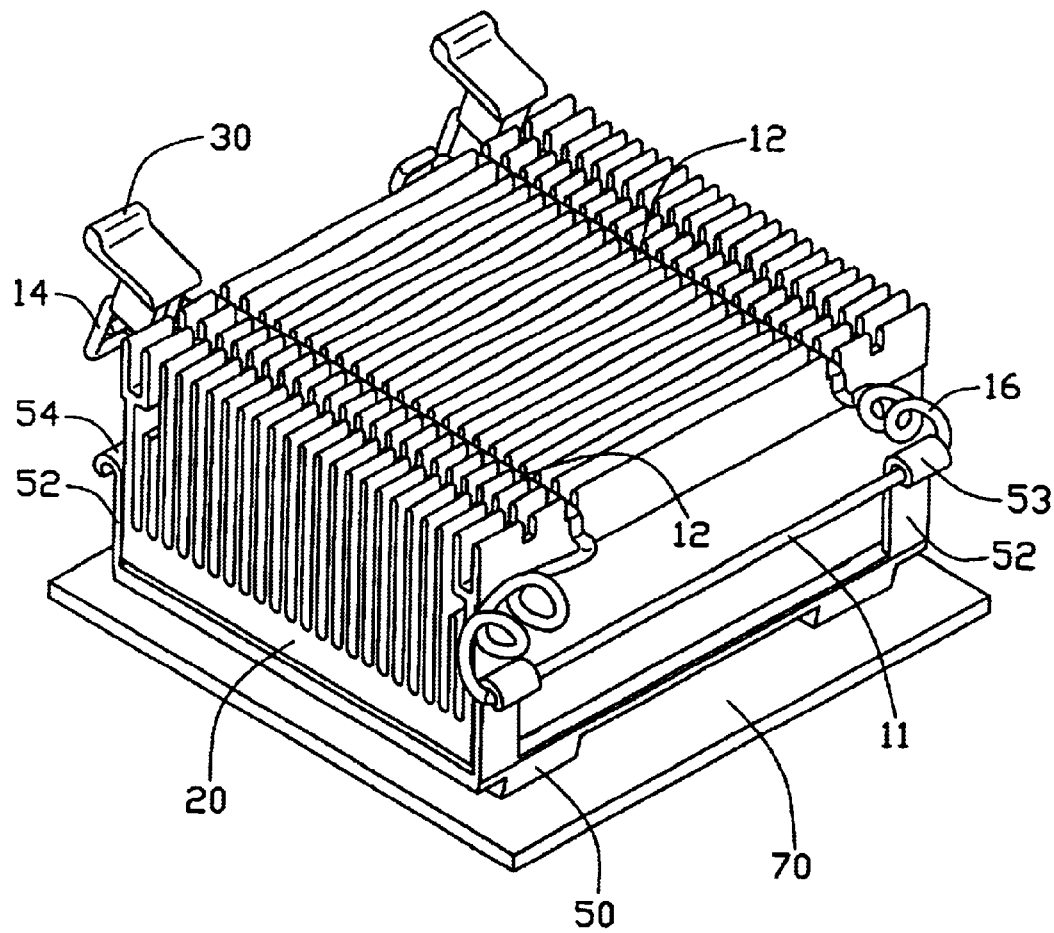
FIG. 3 is a more fully assembled view of FIG. 1, but viewed from another aspect.
Figure 4:
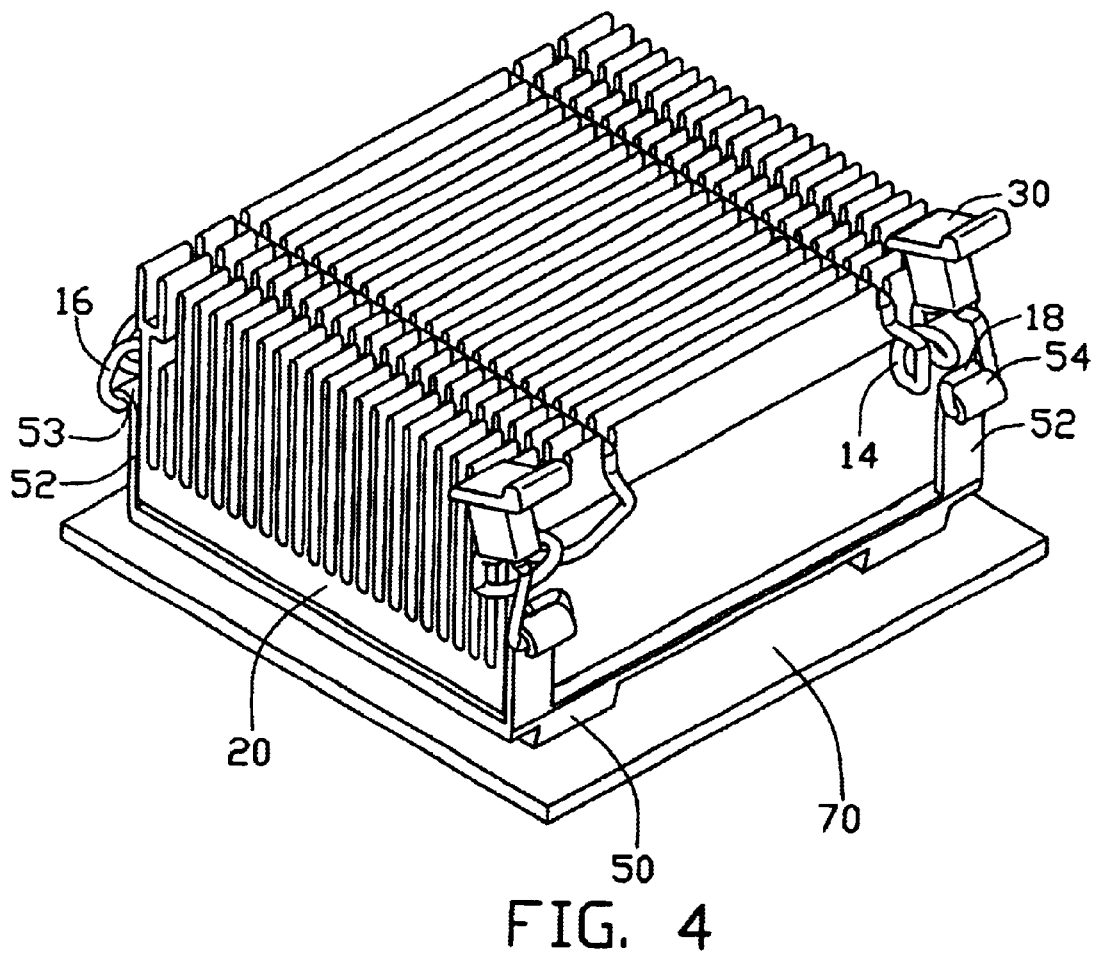
FIG. 4 is a fully assembled view of FIG. 1.

Referring to FIGS. 1–4, a heat sink clip assembly in accordance with a preferred embodiment of the present invention includes a clip 10 and a frame 50.

The clip 10 is formed from a single strand of resilient metallic material that is bent and coiled to become generally U-shaped. The clip 10 comprises a retaining bar 11, and two confining poles 12 extending perpendicularly in a same direction from opposite ends of the retaining bar 11 respectively. Each confining pole 12 comprises a first resilient section 14 near a distal end of the confining pole 12, a generally rectangular loop fastener 18 at the distal end of the confining pole 12, and a second resilient section 16 adjacent the retaining bar 11. The second resilient section 16 comprises a plurality of coiled loops. Each confining pole 12 at the first resilient section 14 extends downwardly, bends and coils to form a plurality of loops, and extends back upwardly to form a pressed head 142. A handle 30 is attached onto each pressed head 142 for facilitating pressing of the confining pole 12.

The frame 50 comprises a flat rectangular board securely fixed on a circuit board 70, and four locking fingers 52 extending perpendicularly upwardly from four corners of the flat rectangular board respectively. A rectangular opening 51 is defined in a middle of the flat rectangular board, for accommodating an electronic device 60 attached to the circuit board 70. Two of the locking fingers 52 at one side of the flat rectangular board each have a hook 53 outwardly formed at a distal end thereof, for locking the retaining bar 11 of the clip 10 thereto. Two of the locking fingers 52 at an opposite side of the flat rectangular board each have a hook 54 outwardly formed at a distal end thereof, for locking a respective one of the fasteners 18 of the clip 10 thereto.

The heat sink 20 comprises a base 21, and a plurality of parallel fins 23 extending perpendicularly upwardly from the base 21. A pair of parallel grooves 25 is transversely defined through top portions of the fins 23, such that the grooves 25 are disposed near ends of the fins 23 at one side of the heat sink 20. A pair of parallel grooves 26 is transversely defined through top portions of the fins 23, such that the grooves 26 are disposed near ends of the fins 23 at an opposite side of the heat sink 20.

In assembly, the frame 50 is fixed on the circuit board 70. The electronic device 60 is thus disposed in the rectangular opening 51 of the frame 50. The heat sink 20 is placed on the electronic device 60, such that the heat sink 20 is disposed between the locking fingers 52 of the frame 50. The confining poles 12 of the clip 10 are respectively inserted into one of the grooves 25 and one of the grooves 26 of the heat sink 20, the grooves 25, 26 being selected according to a size of the clip 10. The handles 30 are fixed on the pressed heads 142 of the clip 10 (see FIG. 2). The retaining bar 11 of the clip 10 is pushed downwardly and resiliently locked with the hooks 53 of the frame 50. The second resilient sections 16 of the clip 10 are thus stretchedly disposed at one side of the heat sink 20 (see FIG. 3). The handles 30 are pressed downwardly until the fasteners 18 of the clip 10 are resiliently locked with the hooks 54 of the frame 50. The first resilient sections 14 are thus stretchedly disposed at an opposite side of the heat sink 20 (see FIG. 4). Assembly is thus completed. The first resilient sections 14 and second resilient sections 16 are elastically stretched, therefore the clip 10 resiliently and firmly attaches the heat sink 20 to the electronic device 60. To disassemble, the handles 30 are pressed downwardly so that the fasteners 18 can be disengaged from the hooks 54. Then the above-described assembly procedure is performed essentially in reverse.

Figure 5:
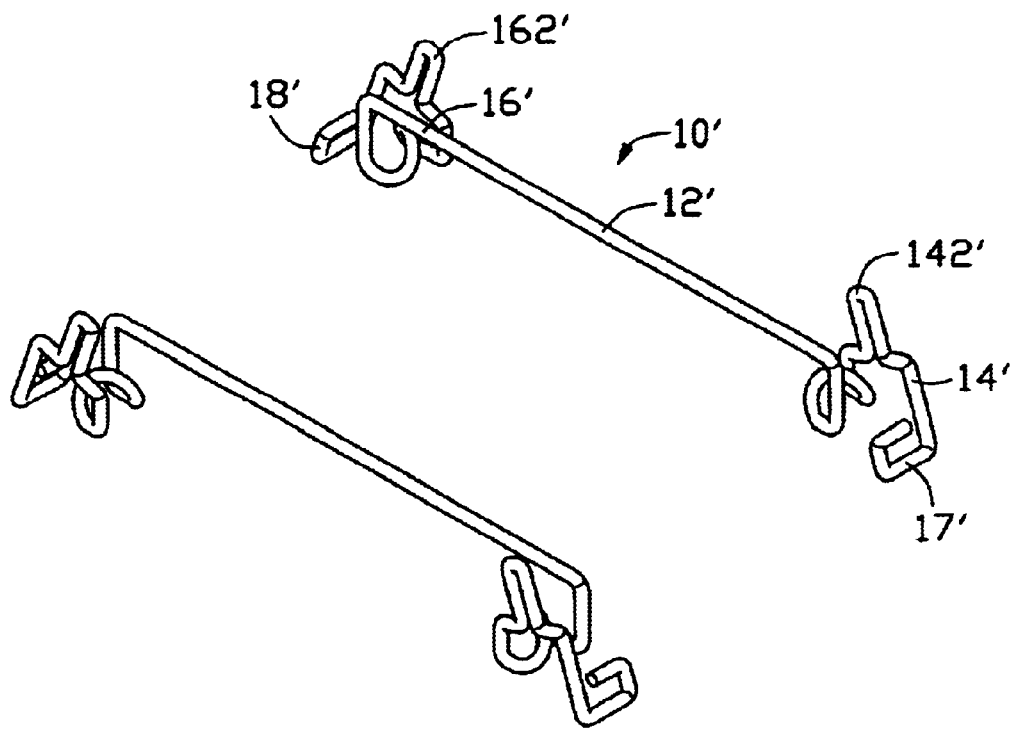
FIG. 5 is a perspective view of a pair of clips in accordance with an alternative embodiment of the present invention.

FIG. 5 shows a pair of clips 10' in accordance with an alternative embodiment of the present invention. The pair of clips 10' is similar to the clip 10 of the preferred embodiment. Each clip 10' is formed from a single strand of resilient metallic material. The clip 10' comprises a confining pole 12'. The confining pole 12' comprises a first resilient section 14' at one end thereof, and a second resilient section 16' at an opposite end thereof. The first and second resilient sections 14', 16' are similar in structure to each other, and both comprise a plurality of coiled loops. The first resilient section 14' comprises a pressed head 142' and a generally rectangular loop fastener 17'. The second resilient section 16' comprises a pressed head 162' and a generally rectangular loop fastener 18'. There is no retaining bar, which simplifies the structure of the clips 10' and reduces costs. Assembly using the pair of clips 10' is similar to the above-described assembly of the heat sink clip assembly of the preferred embodiment. However, four handles 30 are required. Reference is made to the foregoing description of assembly of the heat sink assembly of the preferred embodiment, with due alteration of details.

Figure 6:
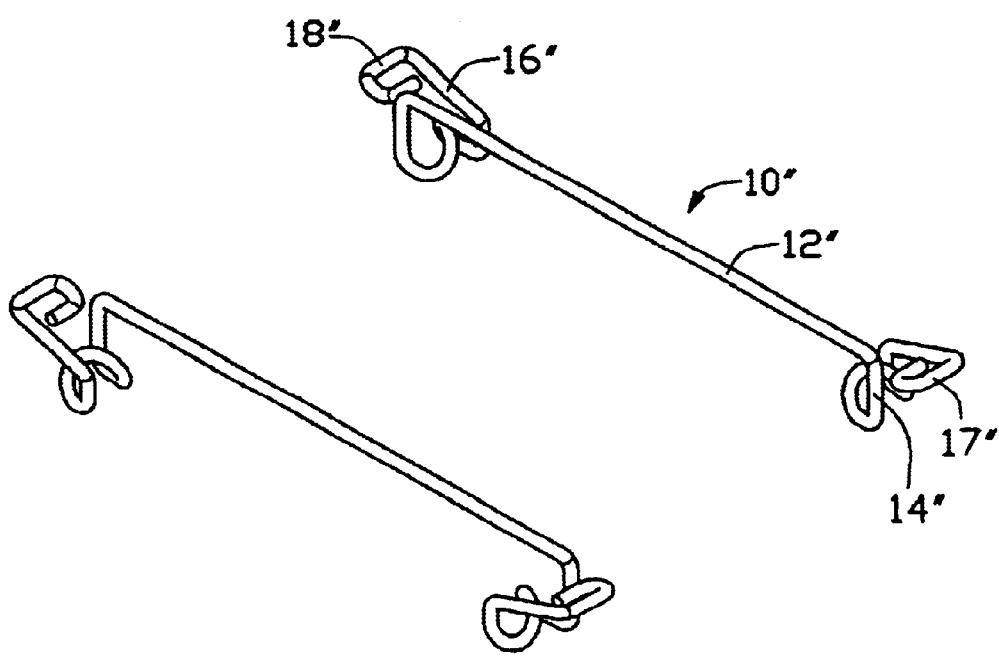
FIG. 6 is a perspective view of a pair of clips in accordance with a further alternative embodiment of the present invention.

FIG. 6 shows a pair of clips 10" in accordance with a further alternative embodiment of the present invention. The pair of clips 10" is similar to the pair of clips 10' of the alternative embodiment. Each clip 10" comprises a confining pole 12", a first resilient section 14", a second resilient section 16", a fastener 17", and a fastener 18". The first and second resilient sections 14", 16" are shaped differently from the first and second resilient sections 14', 16' of the alternative embodiment. In particular, the first and second resilient sections 14", 16" do not have any pressed heads. The fasteners 17", 18" differ from the fasteners 17', 18' of the alternative embodiment. In particular, a distance respectively between each fastener 17", 18" and the confining pole 12" is reduced. Furthermore, an orientation respectively of each fastener 17", 18" relative to the confining pole 12" is changed such that each fastener 17", 18" is in closer alignment with the confining pole 12". No handles are required, which simplifies the structure of the clips 10" and reduces costs. Assembly using the pair of clips 10" is similar to the above-described assembly of the heat sink clip assembly of the preferred embodiment. Reference is made to the foregoing description of assembly of the heat sink assembly of the preferred embodiment, with due alteration of details.

It is to be understood that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat sink clip assembly for attaching a heat sink to an electronic device, the heat sink clip assembly comprising:
   a clip having two poles and a bar connecting between the poles, each of the poles comprising a first resilient section at a free end thereof, the first resilient section comprising a plurality of coiled loops, a fastener being formed at the first resilient section; and
   a frame comprising a plurality of hooks to lock the bar and the fasteners of the clip.

2. The heat sink clip assembly as claimed in claim 1, wherein the frame has a plurality of locking fingers extending perpendicularly p upwardly from a board thereof, and the hooks are arranged at distal ends of the locking fingers.

3. The heat sink clip assembly as claimed in claim 2, wherein the clip is formed from a single piece of resilient metallic wire, and the poles extend substantially perpendicularly in a same direction from opposite ends of the bar respectively.

4. The heat sink clip assembly as claimed in claim 3, wherein each of the poles comprises a second resilient section connecting the pole and the bar.

5. The heat sink clip assembly as claimed in claim 4, wherein the second resilient section comprises a plurality of coiled loops.

6. The heat sink clip assembly as claimed in claim 1, wherein the pole at the first resilient section extends, bends and coils to form the plurality of loops, the fastener is formed at a distal end of the first resilient section, and the fastener is a loop.

7. The beat sink clip assembly as claimed in claim 6, wherein the first resilient section has a pressed head.

8. The heat sink clip assembly as claimed in claim 7, wherein a handle is attached to the pressed head for facilitating pressing of the pole.

9. A heat sink clip assembly for attaching a heat sink to an electronic device, the heat sink defining at least one groove, the heat sink clip assembly comprising:
   at least one clip formed from a single piece of metallic wire, the at least one clip comprising a confining pole adapted to be received in the at least one groove of the heat sink, and two resilient sections at opposite free ends thereof, the confining pole comprising a fastener at each of the resilient sections thereof, at least one of the resilient sections comprising a plurality of loops; and
   a frame comprising a plurality of hooks to lock the fasteners of the clip.

10. The heat sink clip assembly as claimed in claim 9, wherein the frame has a plurality of locking fingers extending perpendicularly upwardly from a board thereof, and the hooks are arranged distal ends of the locking fingers.

11. The heat sink clip assembly as claimed in claim 10, wherein the heat sink clip assembly comprises a pair of clips.

12. The heat sink clip assembly as claimed in claim 11, wherein the fastener is formed at a distal end of the respective resilient section, and the fastener is a loop.

13. The heat sink clip assembly as claimed in claim 12, wherein each of the resilient sections has a pressed head.

14. The heat sink clip assembly as claimed in claim 13, wherein a handle is attached onto the pressed head.

15. A heat sink assembly comprising:
   a heat
   a frame arranged below the heat sink, the frame comprising hooks; and a clip comprising a pole on pressed on the heat sink, a pair of opposite ends extending beyond the heat sink, and a first resilient section extending from the pole to one of the opposite ends of the clip, the first resilient section comprising a plurality of loops opposite ends of the clip respectively engaging with the hooks of the frame.

16. The heat sink assembly as claimed in claim 15, wherein the clip comprises a bar opposing to the first resilient section, a pair of said poles extending in substantially perpendicularly in a same direction from opposite ends of the bar respectively, and a pair of second resilient sections formed adjacent to the bar, each of the second resilient sections comprising at least one coiled loop, each of the poles comprising a fastener formed at the first resilient section and engaging with a corresponding hook.

17. The heat sink assembly as claimed in claim 15, wherein the frame has a plurality of locking fingers extending perpendicularly upwardly from a board thereof, and the hooks are arranged at distal ends of the locking fingers.

18. A heat sink assembly comprising:

a heat sink defining a plurality of grooves;

a frame disposed around a periphery of the heat sink and defining locking hooks thereon;

at least one clip formed and bent from a round wire and including a first straight section extending along a lengthwise direction through the corresponding groove, a resilient section, with a shape of plural coiled loops, generally extending from said first straight section in a transverse direction perpendicular to said lengthwise direction, and a locking section extending from said resilient section, generally along a plane perpendicular to said transverse direction, with a locking loop, at thereof a distal end, latchably engaged with the corresponding locking hook.

* * * * *